(12) United States Patent
Han et al.

(10) Patent No.: US 11,099,440 B2
(45) Date of Patent: Aug. 24, 2021

(54) DISPLAY DEVICE AND ARRAY SUBSTRATE THEREOF

(71) Applicant: Wuhan China Star Optoelectronics Technology Co., Ltd., Hubei (CN)

(72) Inventors: Yuebai Han, Hubei (CN); Jiawei Zhang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 493 days.

(21) Appl. No.: 16/071,525

(22) PCT Filed: May 22, 2018

(86) PCT No.: PCT/CN2018/087787
§ 371 (c)(1),
(2) Date: Jul. 20, 2018

(87) PCT Pub. No.: WO2019/184070
PCT Pub. Date: Oct. 3, 2019

(65) Prior Publication Data
US 2021/0080790 A1    Mar. 18, 2021

(30) Foreign Application Priority Data
Mar. 30, 2018    (CN) .......................... 201810275956.0

(51) Int. Cl.
*G02F 1/1362*    (2006.01)
*G02F 1/1333*    (2006.01)
(Continued)

(52) U.S. Cl.
CPC ...... *G02F 1/136209* (2013.01); *G02F 1/1368* (2013.01); *G02F 1/13338* (2013.01);
(Continued)

(58) Field of Classification Search
None
See application file for complete search history.

(56) References Cited

U.S. PATENT DOCUMENTS

2009/0289912 A1    11/2009  Chen et al.
2011/0157039 A1*    6/2011  Shin ...................... G06F 3/0412
                                                                    345/173

(Continued)

FOREIGN PATENT DOCUMENTS

CN    101334564 A    12/2008
CN    103092446 A    5/2013
(Continued)

*Primary Examiner* — Shan Liu
(74) *Attorney, Agent, or Firm* — Leong C. Lei

(57) ABSTRACT

Provided are a display device and an array substrate thereof. The array substrate includes a plurality of pixel units arranged in an array, wherein each of the pixel units comprises a light shielding layer, a thin film transistor, a touch electrode, a scan line and a data line, and the scan line is disposed in a first direction, and the data line is disposed in a second direction, and the scan line crosses the data line, and the pixel unit further comprises a touch signal line, and the touch signal line is at a same layer as the scan line, and two adjacent touch signal lines in the first direction are connected with the light shielding layer, the touch signal line is connected to the light shielding layer through a first via hole, and the touch signal line is connected to the touch electrode through a second via hole.

12 Claims, 3 Drawing Sheets

(51) Int. Cl.
*G02F 1/1368* (2006.01)
*H01L 27/12* (2006.01)
(52) U.S. Cl.
CPC ...... *G02F 1/136286* (2013.01); *H01L 27/124* (2013.01); *H01L 27/1248* (2013.01)

(56) References Cited

U.S. PATENT DOCUMENTS

2016/0291722 A1* 10/2016 Du ................... G06F 3/04164
2017/0123538 A1*  5/2017 Kuo .................. G02F 1/13338
2018/0196565 A1*  7/2018 Qu ..................... H01L 27/124
2019/0235294 A1*  8/2019 Wang ................ G02F 1/13338

FOREIGN PATENT DOCUMENTS

| | | |
|---|---|---|
| CN | 104731412 A | 6/2015 |
| CN | 106168865 A | 11/2016 |
| CN | 106908980 A | 6/2017 |
| KR | 1020150037303 A | 4/2015 |

* cited by examiner

DISPLAY DEVICE AND ARRAY SUBSTRATE THEREOF

RELATED APPLICATIONS

The present application is a National Phase of International Application Number PCT/CN2018/087787, filed May 22, 2018, and claims the priority of China Application No. 201810275956.0, filed Mar. 30, 2018.

FIELD OF THE INVENTION

The present invention relates to a display device field, and more particularly to a display device and an array substrate thereof.

BACKGROUND OF THE INVENTION

The low-temperature polysilicon panels have become the star products in flat panel display products by the high resolution, high mobility, low power consumption and many other advantages, and are widely used in Apple, Samsung, Huawei, Xiaomi, Meizu and other major mobile phones and tablet computers. Due to the complex process of the low-temperature polysilicon device array process, multiple masks are required. Therefore, if the number of masks can be reduced in the low-temperature polysilicon process, the production cost will be effectively reduced. In the currently manufactured In-Cell Touch Panel process, 13 masks are required. In order to save costs, the industry currently uses M2 to deliver touch signals and can achieve 9 masks. However, due to the excessive density of M2, it will cause problems such as reduction of the aperture ratio.

SUMMARY OF THE INVENTION

For solving the aforesaid problem, the present invention provides a display device and an array substrate, which can increase an aperture ratio of the entire display device and can reduce power consumption.

An objective of the present invention is to provide an array substrate, comprising a plurality of pixel units arranged in an array, wherein each of the pixel units comprises a light shielding layer, a thin film transistor, a touch electrode, a scan line and a data line, and the scan line is disposed in a first direction, and the data line is disposed in a second direction, and the scan line crosses the data line, and the pixel unit further comprises a touch signal line, and the touch signal line is at a same layer as the scan line, and two adjacent touch signal lines in the first direction are connected with the light shielding layer, and the touch signal line is connected to the light shielding layer through a first via hole, and the touch signal line is connected to the touch electrode through a second via hole.

Furthermore, the data line covers a portion of the touch signal line in the first direction.

Furthermore, the touch signal line comprises a vertical portion extending along the first direction and a horizontal portion bent from two ends of the vertical portion toward the second direction, and the data line covers the vertical portion, and the horizontal portion is connected to the light shielding layer through the first via hole, and the horizontal portion is connected to the touch electrode through the second via hole.

Furthermore, the horizontal portion is parallel to the scan line.

Furthermore, the vertical portion is perpendicular to the scan line.

Furthermore, the touch signal line is located between two adjacent scan lines.

Furthermore, the light shielding layer comprises a light shielding portion and a bridging portion, and the light shielding portion corresponds to the thin film transistor, and the bridging portion corresponds to the horizontal portion, and the bridging portion is connected to the horizontal portion through the first via hole.

Furthermore, the thin film transistor is a top gate type thin film transistor.

Furthermore, the pixel unit comprises a substrate, the light shielding layer, a buffer layer, a polysilicon layer, a first interlayer dielectric layer, a gate insulating layer, a first metal layer, a second interlayer dielectric layer, a second metal layer, a third interlayer dielectric layer and the touch electrode, and the first metal layer is used to form the scan line and the touch signal line, and the second metal layer is used to form the data line.

The present invention further provides a display device. The display device comprises any one of the aforesaid array substrate.

The pixel unit of the array substrate provided by the present invention further comprises a touch signal line, and the touch signal line is at a same layer as the scan line, and two adjacent touch signal lines in the first direction are connected with the light shielding layer, and the touch signal line is connected to the light shielding layer through a first via hole, and the touch signal line is connected to the touch electrode through a second via hole. The light shielding layer is used as a bridging line between two adjacent touch signal lines. The touch signals are transmitted through the touch signal lines to avoid setting the transmission line of the touch signal directly on the metal layer where the data line is located to result in that a density of the metal layer where the data line is located is too large to limit the size of the pixel. Thus, the aperture ratio is improved and the power consumption is reduced.

DETAILED DESCRIPTION OF PREFERRED EMBODIMENTS

Figure 1:
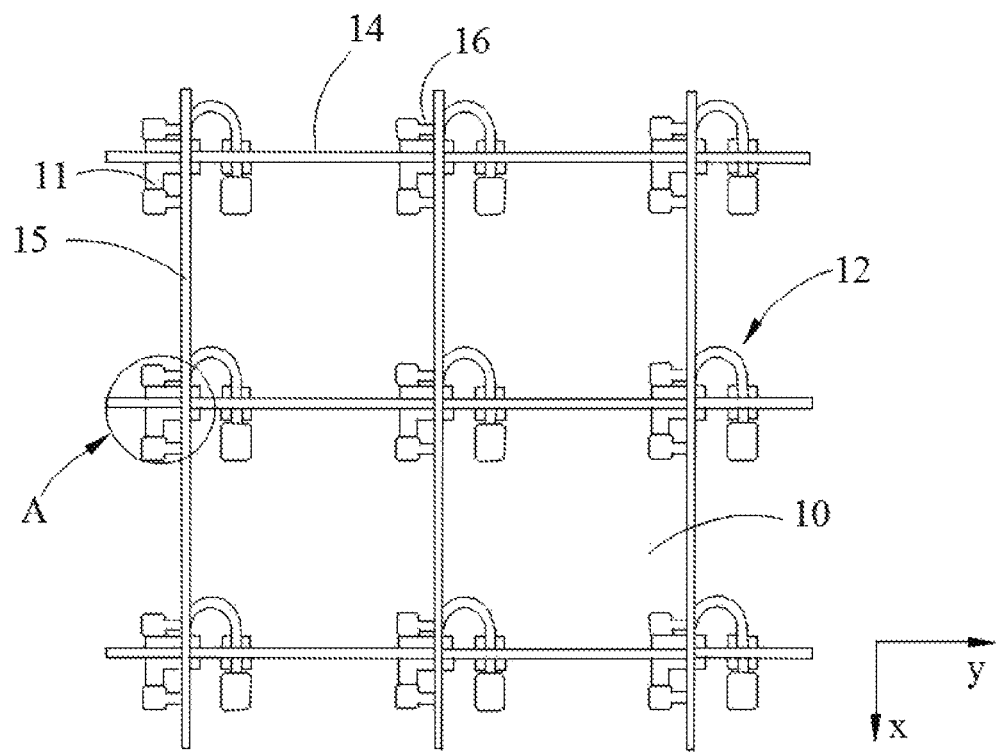
FIG. 1 is a structural diagram of an array substrate.

Hereinafter, the embodiments of the present invention will be described in detail with reference to the accompanying drawings. However, the present invention may be embodied in various different forms and should not be construed as limited to the specific embodiments set forth herein. Rather, these embodiments are provided to explain the principles of the present invention and the practical application thereof to thereby enable those of ordinary skill in the art to understand the various embodiments of the present invention and the various adaptations for the specific intended application. In the drawings, the same reference numerals will be used to refer to the same elements throughout.

Figure 2:
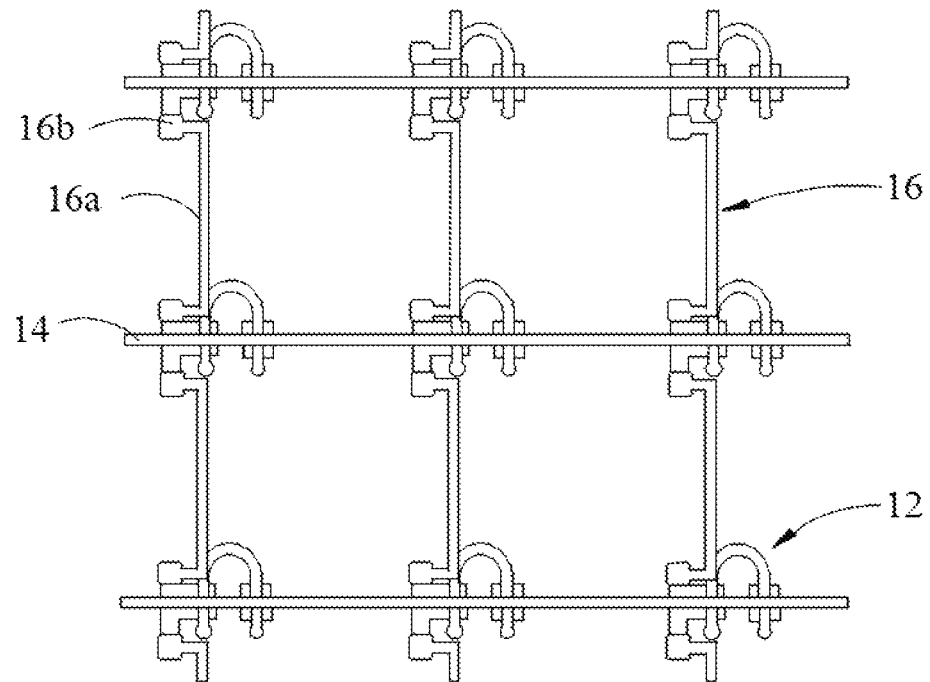
FIG. 2 is a structural diagram of the array substrate in FIG. 1, which does not include a second metal layer.
Figure 3:
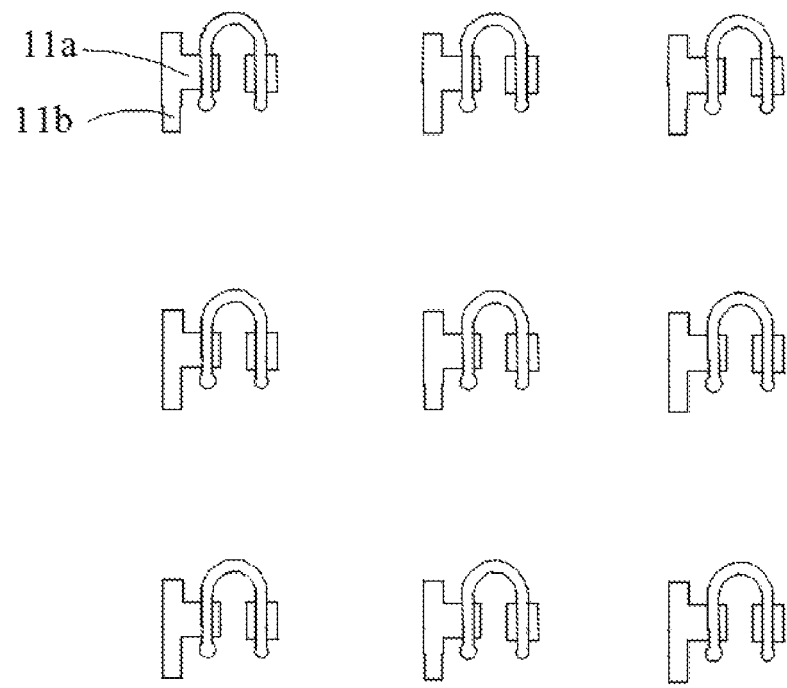
FIG. 3 is a structural diagram of the array substrate in FIG. 2, which does not include a first metal layer.
Figure 4:
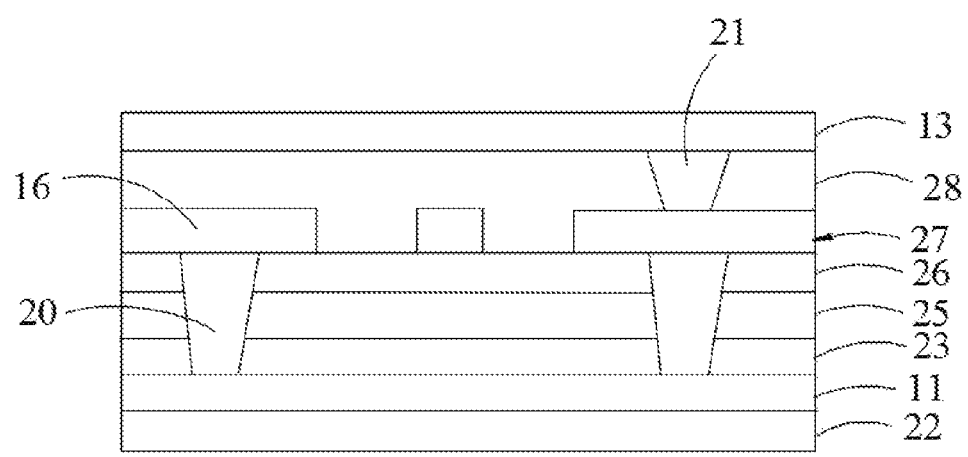
FIG. 4 is a sectional view diagram of A position in FIG. 1 in a first direction.

Please refer to FIGS. 1 to 4. FIG. 1 is a structural diagram of an array substrate eliminating a non-conductive layer and a touch electrode. FIG. 2 is a structural diagram of the array substrate in FIG. 1, which does not include a second metal layer. FIG. 3 is a structural diagram of the array substrate in FIG. 2, which does not include a first metal layer. FIG. 4 is a sectional view diagram of A position in FIG. 1 in a first direction. The structure of the array substrate of this embodiment will be described in detail with reference to FIGS. 1-3.

The array substrate 1 provided by this embodiment comprises a plurality of pixel units 10 arranged in an array, wherein each of the pixel units 10 comprises a light shielding layer 11, a thin film transistor 12, a touch electrode 13, a scan line 14 and a data line 15, and the scan line 14 is disposed in a first direction, and the data line 15 is disposed in a second direction, and the scan line 14 crosses the data line 15. The pixel unit 10 further comprises a touch signal line 16, and the touch signal line 16 is at a same layer as the scan line 14, and two adjacent touch signal lines 16 in the first direction are connected with the light shielding layer 11, and the touch signal line 16 is connected to the light shielding layer 11 through a first via hole 20, and the touch signal line 16 is connected to the touch electrode 13 through a second via hole 21.

The pixel unit 10 further comprises a pixel electrode (not shown). The pixel electrode is formed in the upper metal layer of the touch electrode 13. The pixel electrode is connected to the scan line 14 and the data line 15 through the thin film transistor 12.

The first direction in this embodiment is the x-axis direction in FIG. 1, and the second direction is the y-axis direction in FIG. 1, and the first direction is perpendicular to the second direction. The plurality of scan lines 14 arranged in the first direction intersects with the plurality of data lines 15 arranged in the second direction to form the plurality of pixel units 10 arranged in an array in a grid form. Each of the grid regions forms one pixel unit 10. The array substrate 1 comprises a display area and a non-display area, wherein the area where the thin film transistor 12 is located is the non-display area of the array substrate 1. The pixel electrode and the touch electrode 13 in this embodiment are both transparent electrodes.

The touch electrode 13 is used for receiving the touch signal and transmitting the touch signal to the touch signal line 16 through the second via hole 21. The touch signal line 16 transmits the touch signal to the light shielding layer 11 through the first via hole 20, and then the light shielding layer 11 transmits the touch signal through the first via hole 20 to another touch signal line 16 adjacent to the touch signal line 16 in the first direction. The light shielding layer 11 is used as a bridging line between two adjacent touch signal lines 16. The touch signals are transmitted through the touch signal lines 16 to avoid setting the transmission line of the touch signal directly on the metal layer where the data line 15 is located to result in that a density of the metal layer where the data line 15 is located is too large to limit the size of the pixel. Thus, the aperture ratio is improved and the power consumption is reduced.

Preferably, the data line 15 covers a portion of the touch signal line 16 in the first direction. Namely, A projection of the data line 15 in the plane where the touch signal line 16 is located coincides with the portion of the touch signal line 16 located on the x-axis. Thus, the touch signal lines 16 do not affect the size of the pixels of the array substrate 1, thereby further increasing the aperture ratio and reducing the power consumption.

Specifically, the touch signal line 16 comprises a vertical portion 16a extending along the first direction and a horizontal portion 16b bent from two ends of the vertical portion 16a toward the second direction, and the data line 15 covers the vertical portion 16a. Namely, a projection of the data line 15 in the plane where the touch signal line 16 is located coincides with the vertical portion 16a. The horizontal portion 16b is connected to the light shielding layer 11 through the first via hole 20, and the horizontal portion 16b is connected to the touch electrode 13 through the second via hole 21. The light shielding layer 11 is respectively connected with two adjacent touch signal lines 16 in the first direction through the first via holes 20, so as to bridge the touch signal lines 16 in the first direction.

The light shielding layer 11 comprises a light shielding portion 11a and a bridging portion 11b, and the light shielding portion 11a corresponds to the thin film transistor 12, and the bridging portion 11b corresponds to the horizontal portion 16b, and the bridging portion 11b is connected to the horizontal portion 16b through the first via hole 20.

The horizontal portion 16b is parallel to the scan line 14, and the vertical portion 16b is perpendicular to the scan line 14, i.e., the horizontal portion 16b is perpendicular to the vertical portion 16a. The touch signal line 16 is located between two adjacent scan lines 14.

The thin film transistor 12 in this embodiment is a top gate type thin film transistor. Specifically, the pixel unit 10 comprises a substrate 22, the light shielding layer 11, a buffer layer 23, a polysilicon layer 24, a first interlayer dielectric layer 25, a gate insulating layer 26, a first metal layer 27, a second interlayer dielectric layer, a second metal layer, a third interlayer dielectric layer 28, the touch electrode 13, a fourth interlayer dielectric layer and a pixel electrode.

The light shielding layer 11 is disposed on the substrate 22. The buffer layer 23 is disposed on the substrate 22 and covers the light shielding layer 11. The polysilicon layer 24 is disposed on the buffer layer 23. The first interlayer dielectric layer 25 is disposed on the buffer layer 23 and covers the polysilicon layer 24. The gate insulating layer 26 is disposed on the first interlayer dielectric layer 25. The first metal layer 27 is disposed on the gate insulating layer 26 for forming the touch signal line 16 and the scan line 14. The scan line 14 serves as a gate of thin film transistor 12. The second interlayer dielectric layer covers the first metal layer 27, and the second metal layer is disposed on the second interlayer dielectric layer, and the second metal layer is used to form the data line 15. The third interlayer dielectric layer 28 covers the second metal layer, and the touch electrode 13 is disposed on the third interlayer dielectric layer 28, and the fourth interlayer dielectric layer covers the touch electrode 13, and the pixel electrode is disposed on the fourth interlayer dielectric layer. A source of the thin film transistor 12 is connected to the data line, and a drain of the thin film transistor 12 is connected to the pixel electrode.

The embodiment further provides a display device. The display device can be a liquid crystal display or an organic light emitting display. No restriction is claimed here.

Figure 5:
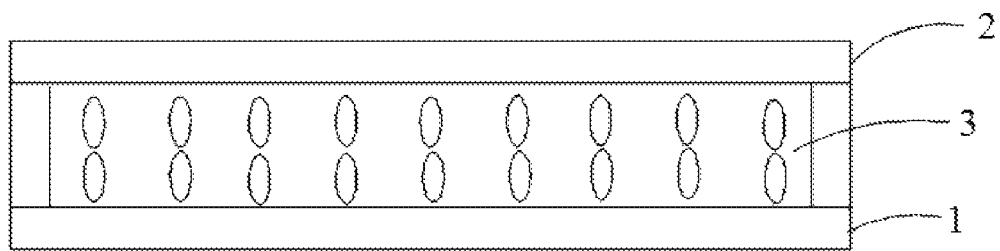
FIG. 5 is a structural diagram of a display device.

Please refer to FIG. 5. A liquid crystal display is illustrated. The display device comprises an array substrate 1, a color filter substrate 2 and a liquid crystal layer 3. The array substrate 1 and the color filter substrate 2 are oppositely arranged for cell. The liquid crystal layer 3 is sandwiched between the array substrate 1 and the color filter substrate 2. The display device can increase the aperture ratio of the entire display device and reduce the power consumption of the display device by adopting the aforesaid array substrate 1.

Above are only specific embodiments of the present application, the scope of the present application is not limited to this, and to any persons who are skilled in the art, change or replacement which is easily derived should be covered by the protected scope of the application. Thus, the protected scope of the application should go by the subject claims.

What is claimed is:

1. An array substrate, comprising a plurality of pixel units arranged in an array, wherein each of the pixel units comprises a light shielding layer, a thin film transistor, a touch electrode, a scan line and a data line, and the scan line is disposed in a first direction, and the data line is disposed in a second direction, and the scan line crosses the data line, and the pixel unit further comprises a touch signal line, and the touch signal line is at a same layer as the scan line, and two adjacent touch signal lines in the first direction are connected with the light shielding layer and the light shielding layer is used as a bridging line between the two adjacent touch signal lines for transmitting touch signals to not to set the touch signal lines at a same layer as the data line to improve aperture ratio of the array substrate, and the touch signal line is connected to the light shielding layer through a first via hole, and the touch signal line is connected to the touch electrode through a second via hole, wherein the touch signal line comprises a vertical portion extending along the first direction and a horizontal portion bent from two ends of the vertical portion toward the second direction, and the data line covers the vertical portion, and the horizontal portion is connected to the light shielding layer through the first via hole, and the horizontal portion is connected to the touch electrode through the second via hole, and wherein the light shielding layer comprises a light shielding portion and a bridging portion extended from the light shielding portion, and the light shielding portion is overlapping with the thin film transistor in a plan view, and the bridging portion is overlapping with the horizontal portion in the plan view, and the bridging portion is connected to the horizontal portion through the first via hole.

2. The array substrate according to claim 1, wherein the horizontal portion is parallel to the scan line.

3. The array substrate according to claim 1, wherein the vertical portion is perpendicular to the scan line.

4. The array substrate according to claim 1, wherein the touch signal line is located between two adjacent scan lines.

5. The array substrate according to claim 1, wherein the thin film transistor is a top gate type thin film transistor.

6. The array substrate according to claim 1, wherein the pixel unit comprises a substrate, the light shielding layer, a buffer layer, a polysilicon layer, a first interlayer dielectric layer, a gate insulating layer, a first metal layer, a second interlayer dielectric layer, a second metal layer, a third interlayer dielectric layer and the touch electrode, and the first metal layer is used to form the scan line and the touch signal line, and the second metal layer is used to form the data line.

7. A display device, comprising an array substrate, wherein the array substrate comprises a plurality of pixel units arranged in an array, and each of the pixel units comprises a light shielding layer, a thin film transistor, a touch electrode, a scan line and a data line, and the scan line is disposed in a first direction, and the data line is disposed in a second direction, and the scan line crosses the data line, and the pixel unit further comprises a touch signal line, and the touch signal line is at a same layer as the scan line, and two adjacent touch signal lines in the first direction are connected with the light shielding layer and the light shielding layer is used as a bridging line between the two adjacent touch signal lines for transmitting touch signals to not to set the touch signal lines at a same layer as the data line to improve aperture ratio of the array substrate, and the touch signal line is connected to the light shielding layer through a first via hole, and the touch signal line is connected to the touch electrode through a second via hole, wherein the touch signal line comprises a vertical portion extending along the first direction and a horizontal portion bent from two ends of the vertical portion toward the second direction, and the data line covers the vertical portion, and the horizontal portion is connected to the light shielding layer through the first via hole, and the horizontal portion is connected to the touch electrode through the second via hole, and wherein the light shielding layer comprises a light shielding portion and a bridging portion extended from the light shielding portion, and the light shielding portion is overlapping with the thin film transistor in a plan view, and the bridging portion is overlapping with the horizontal portion in the plan view, and the bridging portion is connected to the horizontal portion through the first via hole.

8. The display device according to claim 7, wherein the horizontal portion is parallel to the scan line.

9. The display device according to claim 7, wherein the vertical portion is perpendicular to the scan line.

10. The display device according to claim 7, wherein the touch signal line is located between two adjacent scan lines.

11. The display device according to claim 7, wherein the thin film transistor is a top gate type thin film transistor.

12. The display device according to claim 7, wherein the pixel unit comprises a substrate, the light shielding layer, a buffer layer, a polysilicon layer, a first interlayer dielectric layer, a gate insulating layer, a first metal layer, a second interlayer dielectric layer, a second metal layer, a third interlayer dielectric layer and the touch electrode, and the first metal layer is used to form the scan line and the touch signal line, and the second metal layer is used to form the data line.

* * * * *